United States Patent
Sugihara et al.

(10) Patent No.: US 10,784,129 B2
(45) Date of Patent: Sep. 22, 2020

(54) MOUNTING DEVICE AND MOUNTING METHOD

(71) Applicant: FUJI CORPORATION, Chiryu-shi (JP)

(72) Inventors: Kohei Sugihara, Nishio (JP); Hidenori Goto, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 223 days.

(21) Appl. No.: 15/560,538

(22) PCT Filed: Mar. 23, 2015

(86) PCT No.: PCT/JP2015/058714
§ 371 (c)(1),
(2) Date: Sep. 22, 2017

(87) PCT Pub. No.: WO2016/151725
PCT Pub. Date: Sep. 29, 2016

(65) Prior Publication Data
US 2018/0114709 A1    Apr. 26, 2018

(51) Int. Cl.
*H01L 21/67*    (2006.01)
*H01L 33/00*    (2010.01)
(Continued)

(52) U.S. Cl.
CPC ...... *H01L 21/67144* (2013.01); *H01L 21/681* (2013.01); *H01L 21/6836* (2013.01);
(Continued)

(58) Field of Classification Search
CPC ............. H01L 21/67144; H01L 21/681; H01L 21/6836; H01L 22/26; H01L 24/97;
(Continued)

(56) References Cited

U.S. PATENT DOCUMENTS 6,154,954 A * 12/2000 Seto ............... H05K 13/041
                                                 29/740
2010/0257727 A1  10/2010 Hiraki

FOREIGN PATENT DOCUMENTS

JP         2000-150970 A      5/2000
WO     WO 2009/072659 A1     6/2009
(Continued)

OTHER PUBLICATIONS

Extended European Search Report dated Jan. 9, 2018 in Patent Application No. 15886280.5, Citing documents AA, AO and AP therein, 10 pages.
(Continued)

*Primary Examiner* — Peter Dungba Vo
*Assistant Examiner* — Azm A Parvez
(74) *Attorney, Agent, or Firm* — Oblon, McClelland, Maier & Neustadt, L.L.P.

(57) ABSTRACT

A mounting device in which a loading distance separating adjacent characteristic components are lined up side by side is shorter than separation distance between suction nozzle and mark camera, processing to image characteristic component by mark camera and recognize the position of characteristic component is performed consecutively or in one batch. With the mounting device, because mounting head is moved a loading distance that is shorter than the separation distance between suction nozzle and mark camera and image processing is performed consecutively or in one batch, the movement distance of mounting head is shorter.

10 Claims, 6 Drawing Sheets

(51) Int. Cl.
   *H05K 13/08* (2006.01)
   *H01L 21/68* (2006.01)
   *H01L 21/683* (2006.01)
   *H01L 21/66* (2006.01)
   *H01L 23/00* (2006.01)

(52) U.S. Cl.
   CPC .............. *H01L 22/26* (2013.01); *H01L 24/97* (2013.01); *H01L 33/00* (2013.01); *H05K 13/0813* (2018.08); *H05K 13/0853* (2018.08); *H01L 2221/68363* (2013.01); *H01L 2221/68368* (2013.01); *H01L 2224/951* (2013.01); *H01L 2224/95121* (2013.01); *H01L 2224/95136* (2013.01); *H01L 2933/0066* (2013.01)

(58) Field of Classification Search
   CPC ............ H01L 33/00; H01L 2221/68363; H01L 2221/68368; H01L 2224/951; H01L 2224/95121; H01L 2224/95136; H01L 2933/0066; H05K 13/0813; H05K 13/0812; H05K 13/0853
   USPC ... 29/729, 700, 739, 740, 25.01, 25.35, 834, 29/592.1
   See application file for complete search history.

(56) References Cited

FOREIGN PATENT DOCUMENTS

WO    WO 2014/207807 A1     12/2014
WO    WO-2014207807 A1 *    12/2014    ......... H05K 13/0813

OTHER PUBLICATIONS

International Search Report dated Jun. 16, 2015 in PCT/JP2015/058714 filed Mar. 23, 2015.

* cited by examiner

MOUNTING DEVICE AND MOUNTING METHOD

TECHNICAL FIELD

The present application relates to a mounting device and a mounting method.

BACKGROUND ART

Conventionally, there are known mounting devices that cause an LED die to emit light, recognize a light-emitting center of the LED die, perform image recognition of outline reference coordinates with respect to coordinates of the light-emitting center, and position the LED die at a bonding position on a board based on the outline reference coordinates (for example, refer to patent literature 1). With this device, it is possible to mount a light-emitting center of a light-emitting element to a specified position on a board with high accuracy.

CITATION LIST

Patent Literature

Patent literature 1: JP-A-2000-150970

SUMMARY

Technical Problem

However, with the mounting device of patent literature 1, the above processing is performed for a single LED die, and there is a problem in that processing multiple components takes a long time.

The present disclosure takes account of such problems, and an object thereof is to provide a mounting device and a mounting method that shorten mounting processing time for a component formed with a characteristic section on a top surface.

Solution to Problem

The present disclosure uses the following means to achieve the above object.

A mounting device of the present disclosure includes: a mounting head including at least one pickup member configured to pick up a component with a specified characteristic section formed on a top surface, the mounting head being configured to move the picked up component above a board; an imaging section configured to be moved together with the mounting head and to image the top surface of the component; an attachment section to which a feeder including tape that stores the component is attached; and a control section configured to perform control of the mounting head and the imaging section such that, in a state with a loading distance that is a distance between each of multiple of the components arranged in a row being shorter than a separation distance separating the pickup member and the imaging section, processing for imaging the component by the imaging section and for recognizing positions of the components is performed consecutively or in one batch.

Advantageous Effects

With this device, in a state with a loading distance between each of multiple of the components arranged in a row being shorter than a separation distance separating the pickup member and the imaging section, processing for imaging the component by the imaging section and for recognizing positions of the components is performed consecutively or in one batch. Conventionally, after recognizing a position of a component and trying to pick up the component, the imaging section is arranged above the component, imaging is performed, and then the pickup member is arranged above the component, and the component picked up, with these operations being repeated. However, with this device, because the mounting head is moved a loading distance that is shorter than the separation distance between the pickup member and the imaging section and image processing is performed consecutively or in one batch, the movement distance of the mounting head can be made shorter. Thus, with this device, the mounting processing time for components formed with a characteristic section on an upper surface can be made shorter.

DESCRIPTION OF EMBODIMENTS

Figure 1:
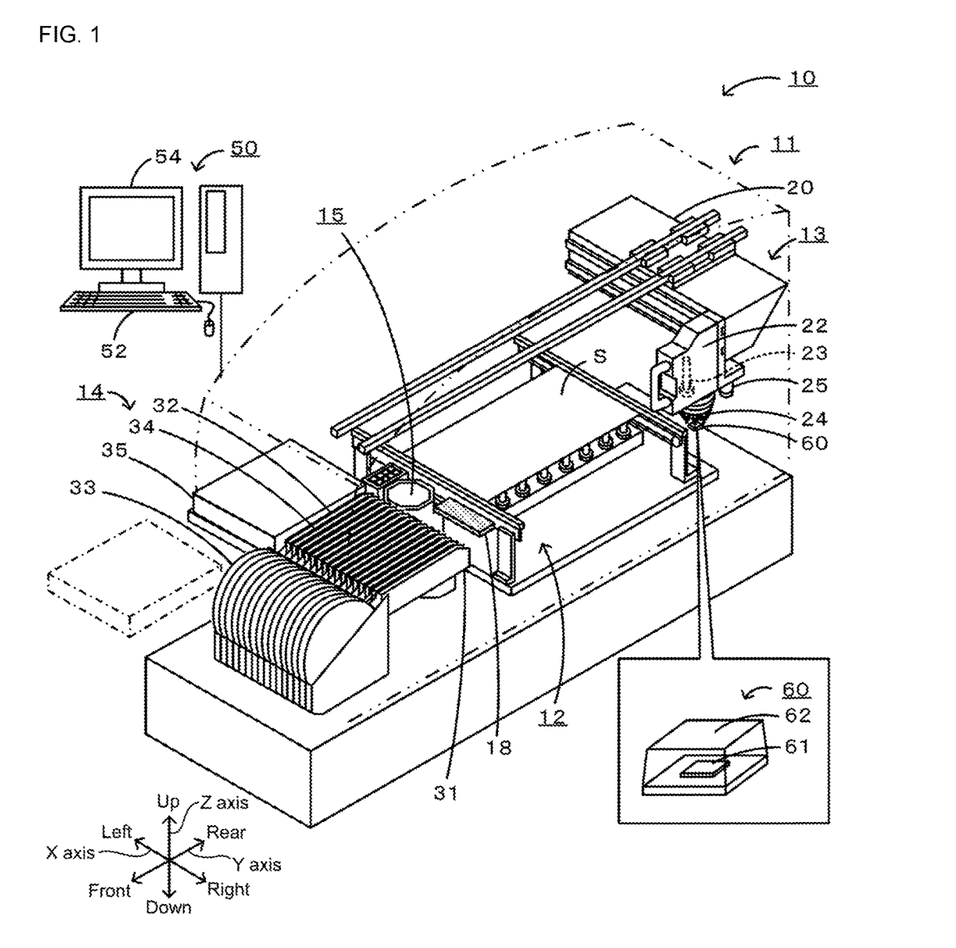
FIG. 1 is a schematic view showing an example of mounting system 10.
Figure 2:
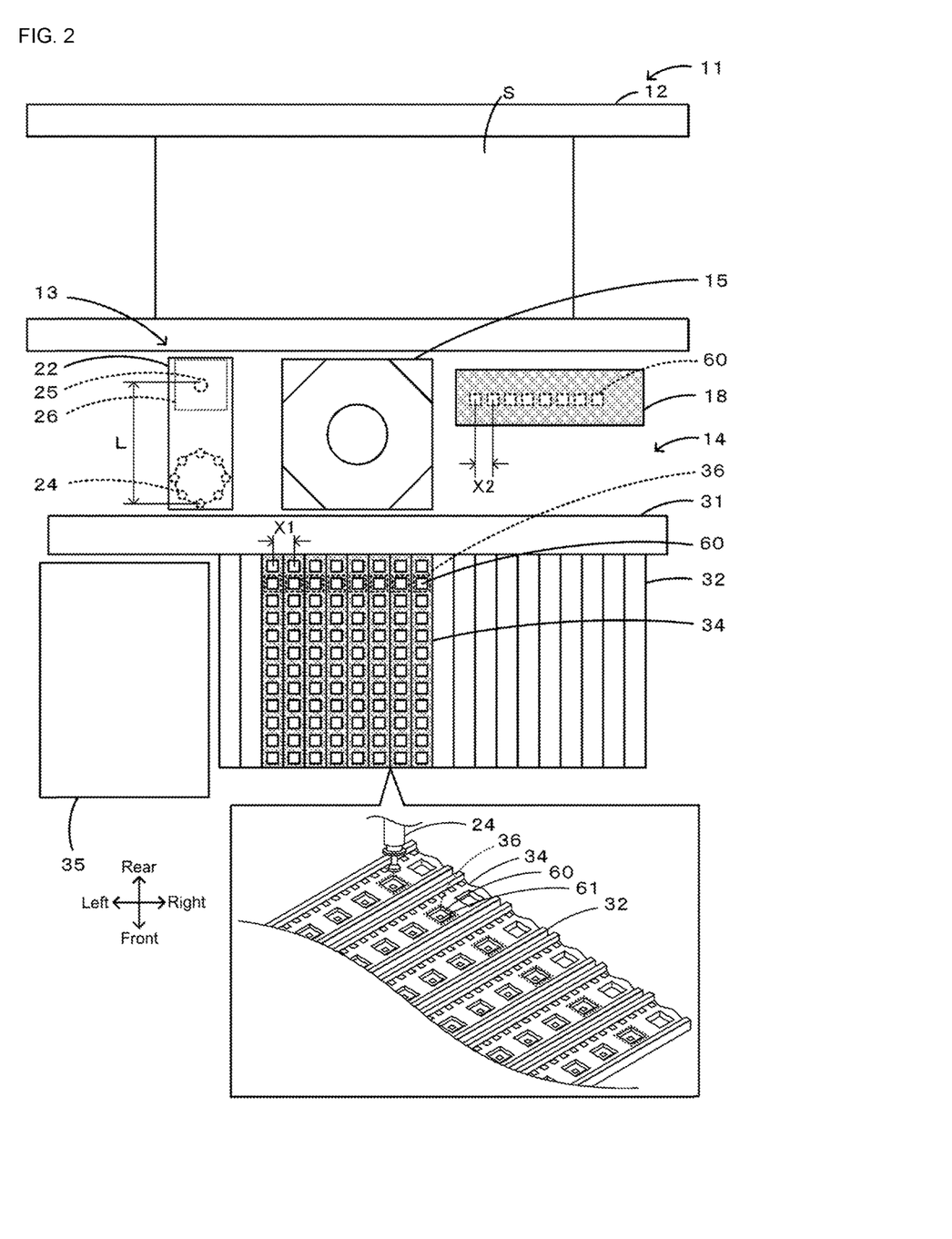
FIG. 2 illustrates an overview of the configuration of mounting device 11.
Figure 3:
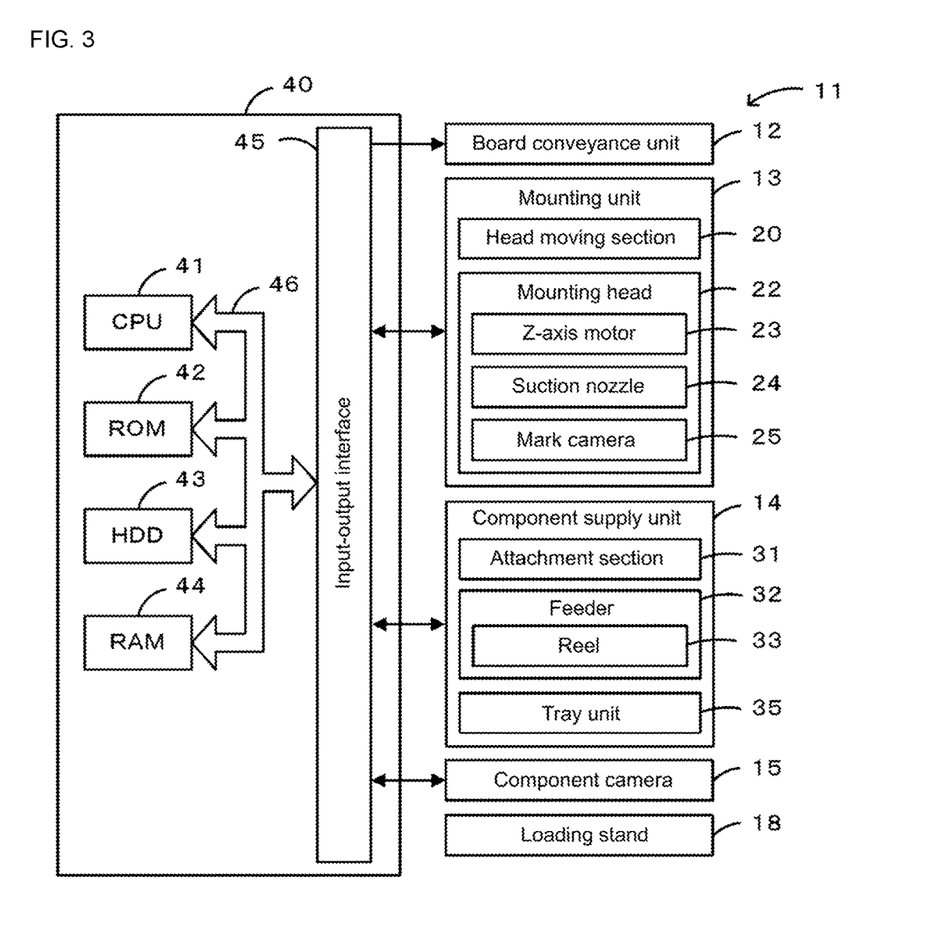
FIG. 3 is a block diagram showing electrical connections of mounting device 11.

Hereinafter, an embodiment of the present disclosure will be described with reference to the figures. FIG. 1 is a schematic view showing an example of mounting system 10. FIG. 2 shows an overview of the configuration of mounting device 11. FIG. 3 is a block diagram showing electrical connections of mounting device 11. Mounting system 10, for example, performs mounting processing for mounting components on board S. Mounting system 10 is provided with mounting device 11 and management computer 50. Multiple mounting devices 11 that perform mounting processing of mounting components on board S are arranged from upstream to downstream in mounting system 10. For ease of understanding, FIG. 1 only shows one mounting device 11. In the present embodiment, left-right directions (X axis), front-rear directions (Y axis), and up-down directions (Z axis) are set as shown in FIGS. 1 and 2.

As shown in FIGS. 1 to 3, mounting device 11 is provided with board conveyance unit 12, mounting unit 13, component supply unit 14, component camera 15, loading stand 18, and control device 40. Board conveyance unit 12 loads board S, conveys board S, fixes board S at a mounting position, and unloads board S. Board conveyance unit 12 includes a pair of conveyor belts provided extending in a left-right direction and separated in the front-rear direction of FIG. 1. Board S is conveyed by these conveyor belts.

Mounting device 11, in addition to normal components for which the component shape can be grasped by imaging the component from the underside, as shown in FIG. 1, performs mounting processing of characteristic component 60 that includes characteristic section 61 on a top surface. Characteristic component 60 includes characteristic section 61 for which features such as the position and shape need to be recognized from the top surface side (also referred to as top surface recognition), and contacting surface 62 that is a top surface that is contacted during pickup. Characteristic section 61, for example, may be a light-emitting body that emits light. That is, characteristic component 60 may be an LED component with an upper section formed from a transparent resin that allows light to pass through.

Mounting unit 13 picks up a component from component supply unit 14 and mounts the component on board S fixed by board conveyance unit 12.

Mounting unit 13 is provided with head moving section 20, mounting head 22, and suction nozzle 24. Head moving section 20 is provided with sliders that move in XY directions guided by guide rails and motors that drive the sliders. Mounting head 22 is removably attached to a slider and is movable in the XY directions by head moving section 20. At least one suction nozzle 24 is removably attached to an underside of mounting head 22. Suction nozzle 24 is a pickup member for picking up a component using pressure, and is removably attached to mounting head 22. Mounting head 22 is equipped with Z-axis motor 23 and the height of suction nozzle 24 is adjusted along the Z-axis by the Z-axis motor. Also, mounting head 22 is provided with a rotation device that uses a drive motor, not shown, to rotate (on its own axis) suction nozzle 24, such that the angle of the component picked up by suction nozzle 24 can be adjusted. Mounting head 22 is configured such that a cylindrical holding body holding multiple (for example, eight or twelve) suction nozzles is rotated, and the suction nozzles 24 are able to be moved downwards at a specified location (here, at a point furthest towards the front of the device).

Mark camera 25 is provided on mounting head 22. Mark camera 25, for example, is able to image board S or components from above. Mark camera 25 is provided on an underside of mounting head 22 (or a slider) and moves together with mounting head 22. Imaging region 26 (refer to FIG. 2) of mark camera 25 is below the camera, and mark camera 25 images reference marks on board S used for grasping the position of board 5, and outputs the images to control device 40. Also, mark camera 25 images an upper surface of characteristic component 60, and outputs the images to control device 40. Mark camera 25 moves in the XV directions with the movement of mounting head 22. As shown in FIG. 2, mark camera 25 is arranged on mounting head 22 so as to be separated from suction nozzle 24 by separation distance L.

With component supply unit 14, multiple feeders 32 provided with reels 33 are removably attached to attachment section 31 (refer to FIG. 3) arranged at the front side of mounting device 11. Tape 34 is wound around each reel 33, and multiple components are held in tape 34 in a lengthwise direction. Tape 34 is unwound to the rear from reel 33, and with a component exposed, is fed to pickup position 36 (refer to FIG. 2) at which the component is picked up by suction nozzle 24. Component supply unit 14 is provided with tray unit 35 that includes a tray on which components are loaded in multiple rows. As shown in FIG. 2, with component supply unit 14, multiple feeders 32 storing characteristic components 60 are attached to attachment section 31 adjacent to each other. Adjacent characteristic components 60 are loaded at a loading distance X1 that is shorter than separation distance L.

Component camera 15 is arranged between board conveyance unit 12 and component supply unit 14. The imaging range of component camera 15 is above component camera 15. Component camera 15 images a component held by suction nozzle 24 when suction nozzle 24 holding the component passes above component camera 15, and outputs the image to control device 40.

Loading stand 18 is arranged between board conveyance device 12 and component supply unit 14, and to the side of component camera 15. Loading stand 18 is supported such that an upper surface thereof on which components are loaded is horizontal, and is used as a provisional loading stand for characteristic components 60. When characteristic component 60 is loaded on loading stand 18, the orientation of characteristic component 60 is more stable compared to when characteristic component 60 is stored in a storage section of tape 34. Loading stand 18 may be formed with a size such that a maximum quantity of characteristic components 60 that can be loaded is the maximum quantity of characteristic components 60 that can be picked up at one time by mounting head 22.

As shown in FIG. 3, control device 40 is configured from a microprocessor based around CPU 41, ROM 42 that memorizes a processing program, HDD 43 that memorizes various data, RAM 44 used as working memory, input-output interface 45 for performing communication of electric signals with external devices, and so on, and these are connected by bus 46. Control device 40 outputs control signals to board conveyance unit 12, mounting unit 13, component supply unit 14, and component camera 15, and receives signals from mounting unit 13, component supply unit 14, and component camera 15.

Management computer (PC) 50 manages information of each device of mounting system 10. Management PC 50 is provided with a control device configured from a microprocessor based around a CPU, and this control device is provided with ROM that memorizes a processing program, an HDD that memorizes various data, RAM used as working memory, an input-output interface for performing communication of electric signals with external devices, and so on. Management PC 50 is provided with input device 52 such as a keyboard and mouse for an operator to input various commands, and display 54 for displaying various information.

Figure 4:
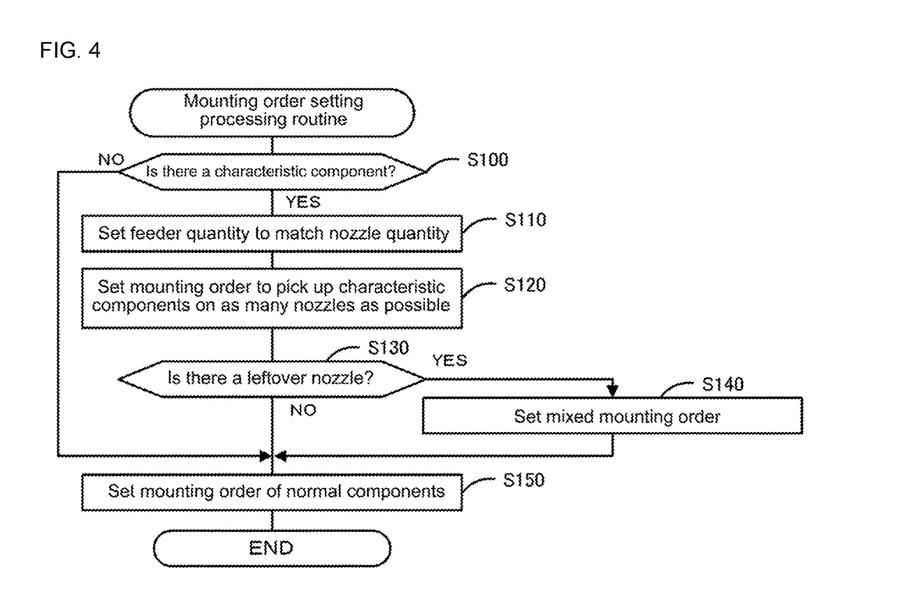
FIG. 4 is a flowchart showing an example of a mounting order setting processing routine.

Next, operation of mounting system 10 of the present embodiment as configured above is described, with the mounting processing of setting mounting job information that includes a mounting order of characteristic component for which a characteristic section on an upper surface side must be recognized being described first. FIG. 4 is a flowchart showing an example of mounting order setting processing performed by the CPU of management PC 50. This routine is memorized on the HDD of management PC 50 and is performed based on a start command from an operator. Here, described specifically is setting a mounting order in a case in which the characteristic components 60 shown in FIG. 1 are to be mounted. Also, here, descriptions are given in a case where twenty characteristic components 60 are mounted during mounting processing, and where eight suction nozzles 24 for picking up characteristic components 60 are attachable to mounting head 22 (refer to FIG. 2). Note that, mounting device 11 is described as an item that also performs mounting processing for normal components that do not require top surface recognition.

When the routine is started, the CPU of management PC 50, first, determines whether characteristic components 60 that require top surface recognition are included in the current mounting processing (step S100), and in a case in which characteristic components 60 are included, sets the quantity of feeders 32 to match the maximum quantity of pickup nozzles 24 for picking up characteristic components 60 that can be attached to mounting head 22 (step S110). For example, in the above embodiment, the CPU of management PC 50 sets a quantity of feeders 32 (specifically, eight feeders) including reels 33 that store characteristic components 60 to be lined up adjacent to each other on attachment section 31 according to suction nozzles 24. This enables the movement distance of mounting head 22 to be shorter.

Next, the CPU of management PC 50 sets the mounting order of characteristic components 60 such that as many suction nozzles 24 as possible can pick up a characteristic component 60 (step S120). For example, in the above embodiment, the CPU specifies settings to perform processing for causing eight suction nozzles 24 to pick up eight characteristic components 60 twice, and to perform processing causing suction nozzles 24 to pick up the remaining four characteristic components 60. Also, for example, the CPU is an item that sets the mounting order such that the movement distance is as short as possible when moving mounting head 22 by one stroke. Continuing, the CPU determines whether there are any leftover nozzles that did not pick up a characteristic component 60 (step S130), and if there is a leftover suction nozzle 24, specifies settings for a mounting order in which normal components that do not require top surface recognition and characteristic components 60 are mixed. The mixed mounting order, for example, corresponds to the third time of the above embodiment. In a case in which normal components and characteristic components 60 are mixed on mounting head 22, in that mounting processing, top surface recognition of characteristic components 60 may be performed with the normal components being held.

After step S140, if there are no leftover suction nozzles 24 in step S130, or if there are no characteristic components 60 in step S100, the CPU of management PC 50 sets the mounting order of the normal components (step S150) and finishes the routine as is. Setting of the mounting order of normal components may be performed, for example, such that the movement distance is as short as possible when moving mounting head 22 in one motion from component supply unit 14 to the mounting position via component camera 15. In this manner, management PC 50 sets mounting job information including a mounting order that avoids as much as possible the mixing of normal components and characteristic components 60 that require top surface recognition on mounting head 22.

Described next is mounting processing of normal components performed by mounting device 11. When mounting processing is started, CPU 41 of control device 40, for example, acquires mounting job information from management PC 50, and performs processing based on the acquired mounting job information. Note that, an operator, before performing this processing, attaches feeders 32 to attachment section 31 in accordance with the contents included in the mounting job information. First, CPU 41 controls mounting unit 13 so as to attach suction nozzles 24 to mounting head 22 in accordance with the normal components to be picked up, and to pick up a normal component from component supply unit 14. Next, CPU 41 causes component camera 15 to image from below the normal component held by mounting head 22. Continuing, CPU 41, based on the image results of component camera 15, determines whether there is a shape error or a pickup position error for the normal component, and if there are no such errors, arranges the normal components on board S, and if there is an error, discards that normal component to a specified discard location. CPU 41 repeats the above processing until all the normal components have been arranged on board S.

Figure 5:
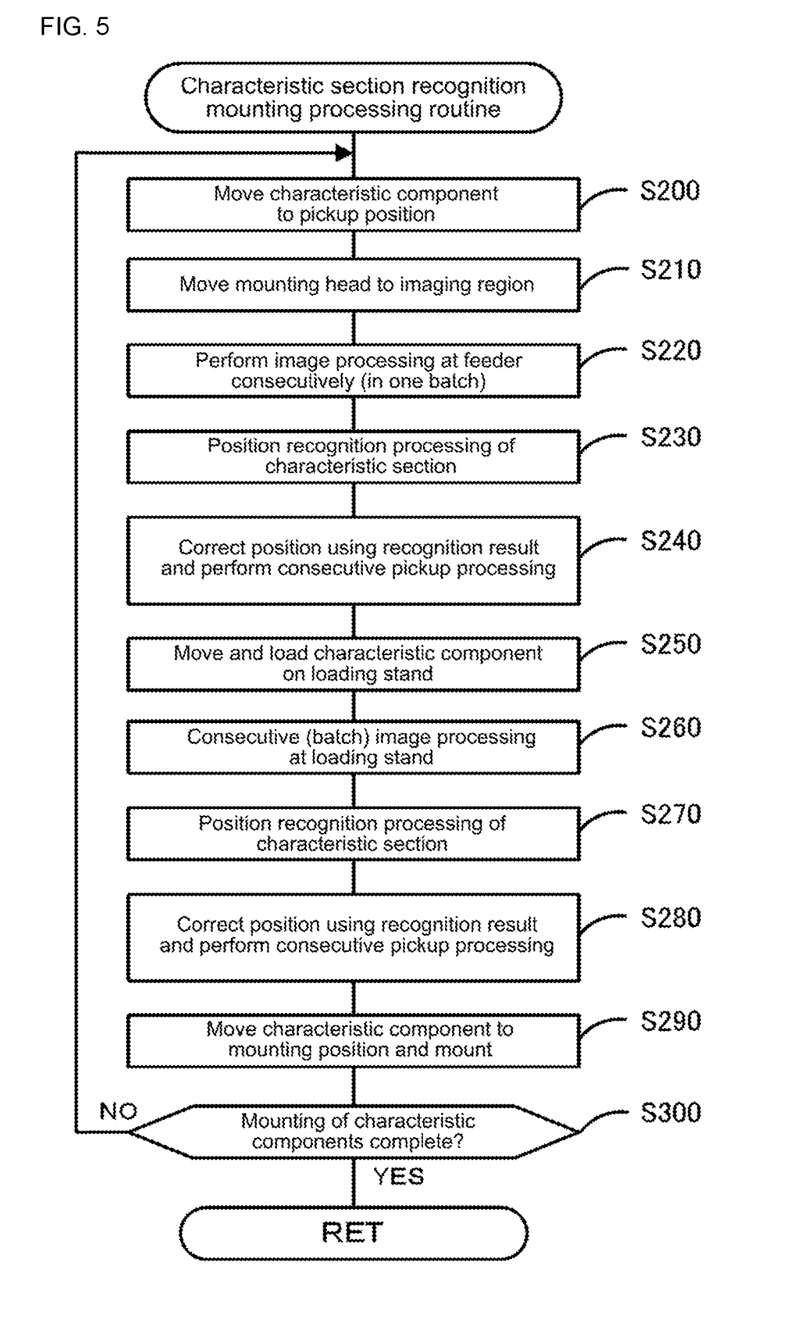
FIG. 5 is a flowchart showing an example of a characteristic section recognition processing routine.
Figure 6:
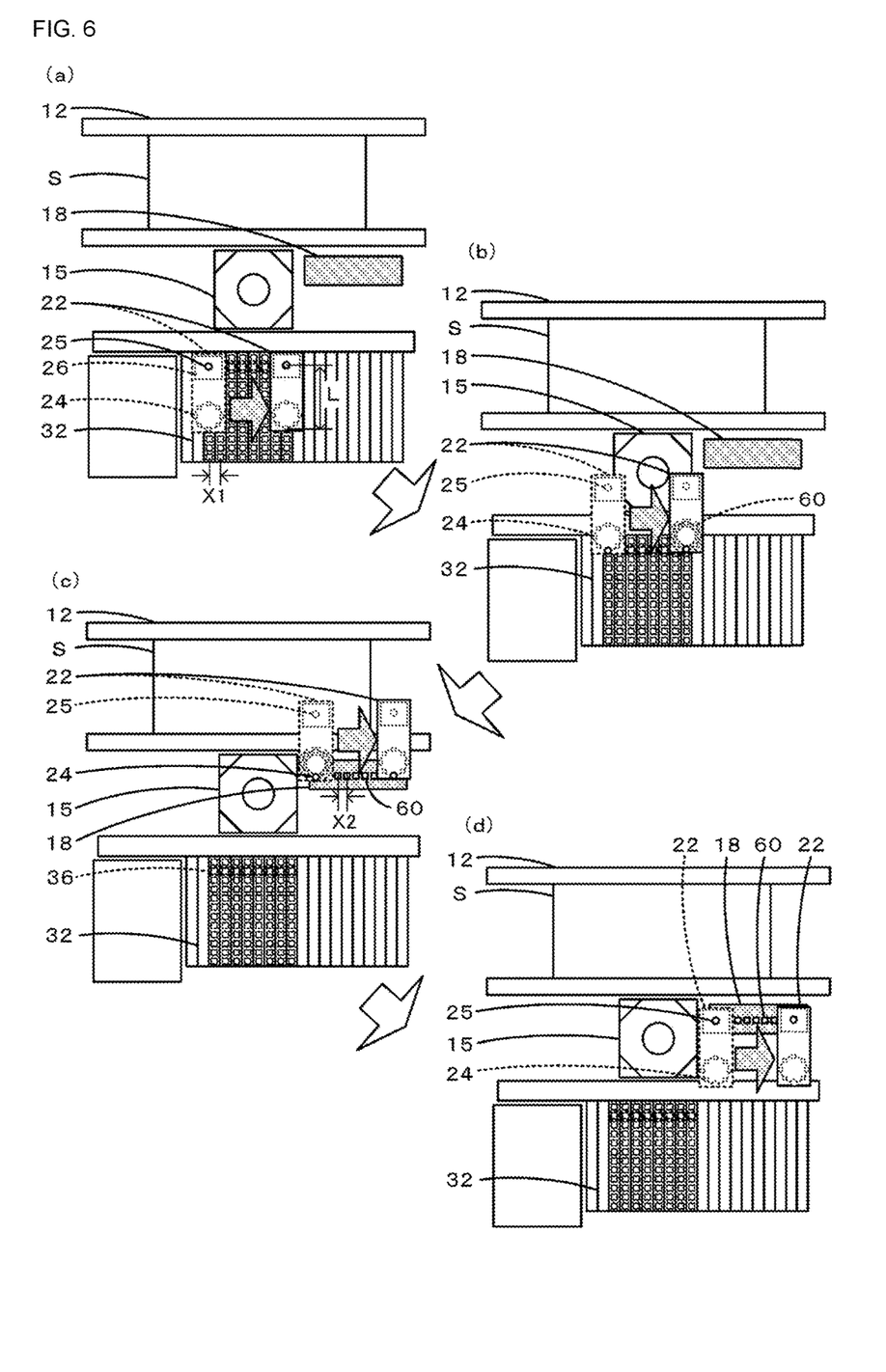
FIG. 6 illustrates processing or recognizing characteristic section 61 of characteristic component 60.

Described next is mounting processing of characteristic components 60 performed by mounting device 11. FIG. 5 is a flowchart showing an example of a characteristic section mounting processing routine performed by CPU 41 of control device 40. FIG. 6 illustrates processing for recognizing characteristic section 61 of characteristic component 60, with FIG. 6(a) showing characteristic section 61 images at feeder 32, FIG. 6(b) showing characteristic section 61 recognized and characteristic component 60 picked up, FIG. 6(c) showing characteristic component 60 loaded on loading stand 18, and FIG. 6(d) showing characteristic section 61 imaged on loading stand 18. This routine is memorized in HDD 43 of control device 40, and is used when a component to be mounted during the above mounting processing is a characteristic component that requires upper surface recognition. Here, descriptions are given as with the above embodiment in which eight suction nozzles 24 are to mount characteristic components 60 on board S. When the routine is started, first, CPU 41 of control device 40 moves characteristic components 60 to be picked up this time to pickup positions 36 at feeders 32 that include reels 33 storing characteristic components 60 and that are attached in a line on attachment section 31 (step S200). Characteristic components 60 that should be picked up are arranged in a row in the left-right direction as shown at the box at the bottom of FIG. 2.

Next, CPU 41 moves mounting head 22 to a position at which characteristic components 60 that are the imaging target enter imaging region 26 of mark camera 25 (step S210), and consecutively (in one batch) performs image processing of characteristic components 60 above feeders 32. Here, CPU 41 repeatedly performs processing of imaging a characteristic component 60 when one characteristic component 60 enters imaging region 26, moving mounting head 22 above an adjacent characteristic component 60, and imaging (refer to FIG. 6[a]). Also, CPU 41 images multiple characteristic components 60 in one batch when multiple characteristic components 60 enter imaging region 26 of mark camera 25. Next, CPU 41 performs processing for recognizing the position of characteristic components 60 using the captured images (step S230). In this processing, for example, coordinates of characteristic section 61 may be calculated by performing binarization processing of the image and determining a pixel value region corresponding to characteristic section 61. Continuing, CPU 41, using position information of the recognized characteristic section 61, performs position correction and performs pickup processing of consecutive characteristic components 60 (step S240). In this processing, CPU 41 repeats processing of picking up characteristic component 60 with suction nozzle 24, changing to the next suction nozzle 24, moving mounting head 22, and picking up the characteristic components 60 stored in an adjacent feeder (refer to FIG. 6[b]). With this mounting device 11, if there is positional deviation when contact occurs with suction nozzle 24, this negatively influences characteristic component 60, but this negative influence on characteristic component 60 is curtailed by performing position correction during pickup. Also, because characteristic components 60 are picked up consecutively, for example, compared to a case of moving separation distance L to perform imaging with mark camera 25 and then pick up with suction nozzle 24, the movement distance of mounting head 22 is shorter.

Continuing, CPU 41 moves characteristic components 60 picked up by suction nozzle 24 to loading stand 18, and loads characteristic components 60 on loading stand 18 (step S250). In this processing, CPU 41, for example, arranges characteristic components 60 such that adjacent characteristic components 60 are separated by loading distance X2 that is shorter than separation distance L (refer to FIGS. 2 and 6[*c*]). Next, CPU 41 performs image processing of characteristic components 60 consecutively (in one batch) on loading stand 18 (step S260). Here, CPU 41 performs similar processing to step S220 (refer to FIG. 6[*d*]). Continuing, CPU 41 performs processing for recognizing the positions of characteristic sections 61 using the captured images (step S270), and, using position information of the recognized characteristic sections 61, performs position correction and pickup processing of consecutive characteristic components 60 (step S280). In this processing, similar processing as with the above steps S230 and S240 is performed. In this manner, with mounting device 11, because recognition of characteristic sections 61 and pickup processing of characteristic components 60 are performed at loading stand 18, compared to a case in which upper surface recognition and pickup processing are performed at tape 34 at which the orientation of characteristic components 60 is not stable, it is possible to perform more accurate upper surface recognition and pickup processing.

Continuing, CPU 41 performs processing to move characteristic components 60 to the mounting positions of board S and perform mounting processing (arrangement processing) (step S290). Then, CPU 41 determines whether mounting of characteristic components 60 has been completed based on the mounting job information (step S300), and if mounting processing of characteristic components 60 has not been completed, performs processing from step S200 again. On the other hand, if mounting processing of characteristic components 60 has been completed, CPU 41 ends the routine. Here, while repeating processing of steps S200 to S300, there are cases in which characteristic components 60 and normal components are mixed on mounting head 22, but in such a case, CPU 41 may perform processing of steps S200 to S290 with the normal components held on suction nozzles 24.

Correspondences between constituent elements of the present embodiment and constituent elements of the disclosure will be clarified here. Suction nozzle 24 of the present embodiment corresponds to the pickup member of the present disclosure, mounting head 22 corresponds to the mounting head, mark camera 25 corresponds to the imaging section, attachment section 31 corresponds to the attachment section, and control device 40 corresponds to the control section. Note that, with the present embodiment, an example of the present disclosure of a mounting method is clear from the description of operation of mounting device 11.

With mounting device 11 of an embodiment described above, in a state in which loading distances X1 and X2 separating adjacent characteristic components 60 that are lined up side by side are shorter than separation distance L between suction nozzle 24 and mark camera 25, processing is performed to image characteristic component 60 by mark camera 25 and recognize the position of characteristic component 60 (characteristic section 61) consecutively or in one batch. Conventionally, after recognizing a position of characteristic component 60 (characteristic section 61) and trying to pick up the characteristic component 60, mark camera 25 is arranged above the characteristic component 60, imaging is performed, and then suction nozzle 24 is arranged above the characteristic component 60, and the characteristic component 60 picked up, with these operations being repeated. However, with mounting device 11, because mounting head 22 is moved loading distance X1 or X2 that is shorter than the separation distance between suction nozzle 24 and mark camera 25, and image processing is performed consecutively or in one batch, the movement distance of mounting head 22 can be made shorter. Thus, with mounting device 11, the mounting processing time for characteristic components 60 formed with characteristic section 61 on an upper surface can be made shorter.

Also, mounting head 22 includes a specified quantity of two or more suction nozzles 24 (for example, eight or twelve), and attachment section 31 has multiple feeders 32 storing characteristic components 60 attached in a lined up manner, the quantity of feeders 32 being equal to the specified quantity. With mounting device 11, by lining up multiple feeders 32 that have tape 34 storing characteristic components 60, because the distance between adjacent characteristic components 60 is shortened, it is possible to have a state in which loading distance X1 is shorter than separation distance L. Further, control device 40, after arranging multiple characteristic components 60 on loading stand 18, performs processing to images the multiple characteristic components 60 on loading stand 18 using mark camera 25 and recognize the position of characteristic components 60 (characteristic sections 61) consecutively or in one batch. With mounting device 11, because characteristic components 60 are picked up from tape 34 and loaded on loading stand 18, it is possible to curtail skewing of components and to achieve a stable orientation, and therefore it is possible to recognize the position of characteristic sections 61 more accurately.

Further, mounting head 22 includes a specified quantity of two or more suction nozzles 24, and attachment section 31 has multiple feeders 32 storing the characteristic components 60 attached in a lined up manner, the quantity of feeders 32 being equal to the specified quantity, and the control section, after performing either consecutively or in one batch processing for recognizing a position of characteristic section 61 by imaging characteristic components 60 at the lined up feeders 32 using mark camera 25, picks up the characteristic components 60 and arranges them on loading stand 18. Then, control device 40 performs processing to image the multiple characteristic components 60 on loading stand 18 using mark camera 25 and recognize the position of characteristic sections 61 consecutively or in one batch. With mounting device 11, it is possible to curtail contact with characteristic sections 61 when moving characteristic components 60 to loading stand 18 due to recognition processing of a component position on feeder 32, and it is possible to more accurately grasp the position of characteristic sections 61 using recognition processing of the component position on loading stand 18.

Also, because mounting device 11 is provided with loading stand 18 that is able to accommodate a quantity of characteristic components 60 equal to or greater than the specified quantity of suction nozzles 24 on mounting head 22, it is possible to load all of the characteristic components 60 picked up by mounting head 22 on loading stand 18, thereby improving the efficiency of recognition processing of the component position. Further, because control device 40 performs position correction using the recognition result of the position of characteristic section 61, and then picks up characteristic component 60 with suction nozzle 24, by using the position recognized by recognition processing of the component position (for example, the position of the characteristic section) it is possible to perform mounting processing of characteristic components 60 more accurately. And, characteristic component 60 is formed with a light-emitting body on a top surface side as a characteristic section. Because this characteristic component 60 formed with a light-emitting body has a center axis of the light emitting section in the upper surface, it is necessary to perform recognition processing of the component position, meaning that there is a strong need to apply the present disclosure.

Also, control device 40, during picking up of characteristic component 60 by mounting head 22 and mounting of characteristic component 60 on board S, causes all suction nozzles 24 to pick up characteristic components 60 with characteristic section 61 formed on a top surface. With mounting device 11, it is possible to perform mounting processing more efficiently, and to shorten mounting processing time. Also, control device 40, in a case in which normal components and characteristic components 60 are mixed on mounting head 22, picks up characteristic components 60 on as many suction nozzles 24 as possible. With mounting device 11, it is possible to perform mounting processing more efficiently, and to shorten mounting processing time.

Meanwhile, it goes without saying that the disclosure is not limited to the above-mentioned embodiment and various embodiments may be applied within the technical scope of the disclosure.

For example, with an embodiment above, descriptions are given of a case in which the quantity of feeders 32 attached to attachment section 31 is the same of the quantity of suction nozzles 24 on mounting head 22, but so long as there are multiple feeders, the configuration is not limited to this, and a quantity of feeders 32 attached to attachment section 31 may be fewer than the quantity of suction nozzles 24. Specifically, mounting device 11, for example, may have eight suction nozzles 24, but four feeders 32 may be lined up. In this case, upper surface recognition processing of four characteristic components 60 may be performed consecutively or in one batch, and after picking up characteristic components 60 consecutively, the same processing may be performed one more time. With such a mounting device, it is possible to make loading distances X1 and X2 shorter than separation distance L, thereby shortening the mounting processing time of characteristic components 60 formed with characteristic section 61 on an upper surface.

With an embodiment above, after performing upper surface recognition processing of characteristic components 60 at feeders 32, upper surface recognition processing of characteristic components 60 is performed at loading stand 18, but one of these may be omitted. For example, if the orientation of characteristic components 60 stored in tape 34 of feeder 32 is stable, recognition of characteristic section 61 and mounting processing may be performed without loading characteristic components 60 on loading stand 18. In such a case, mounting device 11 does not need to be provided with loading stand 18. Also, during pickup operation from tape 34, in a case in which there is no negative influence on characteristic section 61, characteristic components 60 may be moved to loading stand 18 without performing recognition of characteristic section 61 at feeders 32. If recognition of characteristic section 61 is performed at loading stand 18, it is possible to curtail positional deviation at the mounting position of characteristic section 61.

In an embodiment above, loading stand 18 is able to accommodate a quantity of characteristic components 60 equal to or greater than the quantity of suction nozzles 24 on mounting head 22, however, the configuration is not limited to this, and loading stand 18 may only be able to accommodate a quantity of characteristic components 60 fewer than the quantity of suction nozzles 24. In such a case, control device 40 may pick up characteristic components 60 on all suction nozzles 24 of mounting head 22. With this device, control device 40 may move mounting head 22 to loading stand 18 with characteristic components 60 picked up by all the suction nozzles 24 (for example, eight) at feeders 32, and load (for example, four) characteristic components 60 on loading stand 18. Then, control device 40 may perform upper surface recognition of characteristic sections 61 on loading stand 18 with the characteristic components 60 that could not be loaded on loading stand 18 still being held by suction nozzles 24. Continuing, control device 40 may then perform processing to pick up characteristic components 60 for which the upper surface has been recognized and mount the characteristic components 60 on board S. Then, control device 40 may load the remaining characteristic components 60 on loading stand 18, recognize the upper surfaces, and mount those characteristic components 60 on board S. Alternatively, control device 40 may move mounting head 22 to loading stand 18 with characteristic components 60 picked up by all the suction nozzles 24 (for example, eight) at feeders 32, and load (for example, four) characteristic components 60 on loading stand 18. Then, control device 40 may perform upper surface recognition of characteristic sections 61 on loading stand 18 with the characteristic components 60 that could not be loaded on loading stand 18 still being held by suction nozzles 24. Continuing, control device 40 may pick up and hold characteristic components 60 for which the upper surface has been recognized using suction nozzles 24, load the characteristic components 60 for which the upper surface has not been recognized on loading stand 18, and perform upper surface recognition on those components. Also, control device 40 may pick up and hold all characteristic components 60 for which the upper surface has been recognized using suction nozzles 24, and mount the characteristic components 60 on board S. With this device, it is possible to omit movement between loading stand 18 and pickup position 36 of feeder 32, thus, by shortening movement of mounting head 22 to just back and forth between loading stand 18 and board S, mounting processing time for characteristic components 60 can be shortened.

With an embodiment above, the upper surface side of characteristic components 60 is imaged, and position correction is performed using a recognition result of the position of characteristic component 60 (characteristic section 60), but the configuration is not limited to this, and other processing of the captured image may be used. Also, with an embodiment above, descriptions are given of characteristic component 60 for which characteristic section 61 is a light-emitting body, but components are not limited to this, and other components may apply so long as the component requires characteristic section 61 to be imaged from above.

With an embodiment described above, control device 40 tries to pick up characteristic components 60 with all suction nozzles 24, but the configuration is not limited to this, and normal components and characteristic components 60 may be mixed on mounting head 22. Also, in an embodiment above, when there are left over suction nozzles 24 that have not picked up a characteristic component 60, normal components are mixed on mounting head 22, but the configuration is not limited to this, and normal components and characteristic components 60 do not have to be mixed on mounting head 22. However, considering the movement distance of mounting head 22, because it is possible to omit movement between pickup position 36 and loading stand 18, it is desirable to mix components on mounting head 22.

With an embodiment above, mounting device 11 decides whether to perform control to mix characteristic components 60 and normal component on mounting head 22 based on mounting job information set in management PC 50, but the configuration is not limited to this, and control device 40 may be set to decide whether to perform mixing of characteristic components 60 and normal component on mounting head 22.

In an embodiment above, mounting head 22 is provided with suction nozzle 24 as a pickup tool, but the configuration is not limited to this so long as pickup of characteristic component 60 is possible, for example, a mechanical chuck that picks up characteristic component 60 by gripping it may be used.

In an embodiment above, the present disclosure is described as mounting device 11, but the present disclosure may be, for example, a mounting method, or a program run by a computer that performs the above processing. Note that, for the mounting method, various forms of the above mounting device may be used, and steps to realize various functions on the above mounting device may be added.

INDUSTRIAL APPLICABILITY

The present disclosure may be used on a device that performs mounting processing of arranging components on a board.

REFERENCE SIGNS LIST

10: mounting system; 11: mounting device; 12: board conveyance unit; 13: mounting unit; 14: component supply unit; 15: component camera; 18: loading stand; 20: head moving section; 22: mounting head; 23: Z-axis motor; 24: suction nozzle; 25: mark camera; 26: imaging region; 31: attachment section; 32: feeder; 33: reel; 34: tape; 35: tray unit; 36: pickup position; 40: control device; 41: CPU; 42: ROM; 43: HDD; 44: RAM; 45: input-output interface; 46: bus; 50: management computer; 52: input device; 54: display; 60: characteristic component; 61: characteristic section; 62: contacting surface; L: separation distance; S: board; X1, X2: loading distance

The invention claimed is:

1. A mounting device comprising:
a mounting head including at least one pickup member configured to pick up a component of multiple components that are arranged in a row with a specified characteristic section formed on a top surface the component, the mounting head being configured to move a picked up component above a board;
a camera arranged on the mounting head and separated from the at least one pickup member by a separation distance, the camera configured to be moved together with the mounting head and to image the top surface of the component;
an attachment section to which a feeder including tape that stores the multiple components is attached; and
an electronic control device configured to control the mounting head and the camera to image the component by the camera and to recognize positions of the multiple components consecutively or in one batch in a state with a loading distance that is a distance between each of the multiple components arranged in the row is shorter than the separation distance.

2. The mounting device according to claim 1, wherein the mounting head includes a specified quantity of two or more of the pickup members, and the attachment section has multiple feeders storing the multiple components attached in a lined up manner, a quantity of feeders being equal to or less than the specified quantity.

3. The mounting device according to claim 1, further comprising:
a loading stand on which the component is loaded, and wherein
the electronic control device is configured to perform, either consecutively or in one batch, processing for recognizing a position of the component by using the camera to image the multiple components that are on the loading stand after lining up the multiple components on the loading stand.

4. The mounting device according to claim 1, comprising:
a loading stand on which the component is loaded, and wherein
the mounting head includes a specified quantity of two or more of the pickup members,
multiple feeders each storing the multiple components are attached to the attachment section in a lined up manner, a quantity of feeders being equal to or less than the specified quantity, and
the electronic control device, after performing either consecutively or in one batch processing for recognizing a position of the component at the lined up feeders using the camera, is configured to pick up a quantity of the multiple components, line the quantity of the multiple components up on the loading stand, and perform either consecutively or in one batch processing to image the quantity of the multiple components lined up on the loading stand using the camera and recognize the positions of the quantity of the multiple components.

5. The mounting device according to claim 2, further comprising:
a loading stand configured to load a quantity of the multiple components at least equal to the specified quantity of the pickup members.

6. The mounting device according to claim 2, further comprising:
a loading stand configured to load a quantity of the multiple components smaller than the specified quantity of the pickup members, and wherein
the electronic control device is configured to cause all of the specified quantity of the pickup members to pick up the component.

7. The mounting device according to claim 1, wherein
the electronic control device is configured to perform position correction using a result of the recognition of the position of the component, and then to pick up the component using the at least one pickup member.

8. The mounting device according to claim 1, wherein the component has a light-emitting section formed on the top surface as the characteristic section.

9. The mounting device according to claim 1, wherein
the electronic control device, during picking up of the component with the mounting head and mounting of the component on the board, is configured to cause the at least one pickup member to pick up a first component with a top surface on which is formed the specified characteristic section, and a second component with a top surface on which is not formed the specified characteristic section.

10. The mounting device according to claim 1, wherein
the electronic control device, during picking up of the component with the mounting head and mounting of the component on the board, is configured to cause all the pickup members to pick up the component with the top surface on which is formed the specified characteristic section.

* * * * *